United States Patent
Sato et al.

[11] Patent Number: 6,143,609
[45] Date of Patent: *Nov. 7, 2000

[54] METHOD FOR FORMING SEMICONDUCTOR MEMORY DEVICE

[75] Inventors: Kazuo Sato, Takatsuki; Kenji Ueda, Suita; Michio Morita, Habikino; Fumihiko Noro, Ikoma; Kyoko Miyamoto; Hideaki Onishi, both of Kyoto; Kazuo Umeda, Nara; Kazuya Kubo, Yawata, all of Japan

[73] Assignee: Matsushita Electronics Corporation, Osaka, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/824,476

[22] Filed: Dec. 2, 1996

Related U.S. Application Data

[62] Division of application No. 08/677,651, Jul. 8, 1996, Pat. No. 5,838,039.

[30] Foreign Application Priority Data

Jul. 14, 1995 [JP] Japan ................................ 7-179124

[51] Int. Cl.[7] ................................................. H01L 21/336
[52] U.S. Cl. ........................ 438/266; 438/257; 438/267; 438/263
[58] Field of Search ..................................... 438/257, 263, 438/264, 265, 266, 267, 594, 592, 595

[56] References Cited

U.S. PATENT DOCUMENTS

| | | | |
|---|---|---|---|
| 5,070,032 | 12/1991 | Yuan et al. | 438/267 |
| 5,095,344 | 3/1992 | Harari | 257/328 |
| 5,153,144 | 10/1992 | Komori et al. | 438/265 |
| 5,210,044 | 5/1993 | Yoshikawa | 438/257 |
| 5,304,504 | 4/1994 | Wei et al. | 438/592 |
| 5,453,391 | 9/1995 | Yiu | 438/263 |
| 5,576,232 | 11/1996 | Hong | 438/265 |
| 5,591,658 | 1/1997 | Cacharelis | 438/264 |
| 5,686,332 | 11/1997 | Hong | 438/264 |
| 5,712,179 | 1/1998 | Yuan | 438/264 |

*Primary Examiner*—Tuan H. Nguyen
*Assistant Examiner*—Jack Chen
*Attorney, Agent, or Firm*—Morrison & Foerster LLP

[57] ABSTRACT

A floating gate type semiconductor memory and method of manufacture are described including an erasing gate electrode in which a tunneling region can be formed easily and high reliability can be kept. An active region isolated by element isolation insulating films is formed on a semiconductor substrate. A gate insulating film and a floating gate electrode are sequentially formed on the active region. A control gate electrode is formed above the floating gate electrode with a silicon oxide film disposed therebetween. A tunneling insulating film is formed only on the side wall of the floating gate electrode. Then, an erasing gate electrode is formed so as to cover the tunneling insulating film.

6 Claims, 10 Drawing Sheets

METHOD FOR FORMING SEMICONDUCTOR MEMORY DEVICE

This is a divisional of application Ser. No. 08/677,651, filed Jul. 8, 1996, now U.S. Pat. No. 5,838,039.

FIELD OF THE INVENTION

The present invention relates to a floating gate type semiconductor memory having an erasing gate electrode and a method for manufacturing the same.

BACKGROUND OF THE INVENTION

An EPROM (Electrically Programmable Read Only Memory) with a floating gate structure is well-known as an electrically writable nonvolatile memory. The EPROM is structured in such a way that a channel region is provided between source and drain regions on a semiconductor substrate. A first insulating film is formed on the channel region, and a floating gate electrode is formed on the first insulating film. A second insulating film is formed on the floating gate electrode, and a control gate electrode is formed on the second insulating film.

The EPROM performs write operations by applying a high voltage to the drain region and control gate electrode to generate hot electrons in the channel region near the drain of the semiconductor substrate. The EPROM then injects these hot electrons into the floating gate electrode with acceleration.

The EPROM performs read operations by applying an operating voltage to the area between the source and drain regions and the control gate electrode so as to detect the level of current flowing between the source and drain regions.

In general, stored data in an EPROM can be erased by applying ultraviolet rays. Recently, however, EPROMs that can electrically erase the stored data have been widely used. In these EPROMs, the thickness of the first insulating film is reduced, and electrons are discharged through the thin insulating film from the floating gate electrode to the source region, the drain region or the channel region by a tunneling phenomenon so that the stored data can be erased electrically.

In addition, a recent proposal would use an independent erasing gate electrode to erase data from a memory cell structure (see U.S. Pat. No. 5,070,032). Under this arrangement, a tunnel insulating film is formed as a tunneling medium between the erasing gate electrode and the floating gate electrode. An erase voltage is applied to the erasing gate electrode and electrons are tunneled from the floating gate electrode to the erasing gate electrode so that the data is erased. A semiconductor memory which uses the erasing gate electrode is generally referred to as a "flash memory" because all memory cells, or memory cell groups for every block are erased at the same time.

FIG. 8 is a plan view and FIGS. 9(a) and 9(b) are sectional views showing a floating gate type semiconductor memory with an erasing gate according to the prior art. FIG. 9(a) is a sectional view taken along the line A–A' shown in FIG. 8. FIG. 9(b) is a sectional view taken along the line B–B' shown in FIG. 8. In FIGS. 8, 9(a) and 9(b), a semiconductor substrate is indicated at 1, a source region is indicated at 2, a drain region is indicated at 3, a gate insulating film is indicated at 4, a floating gate electrode is indicated at 5, a layer insulating film is indicated at 6, a control gate electrode is indicated at 7, a silicon oxide film used for element isolation is indicated at 8 and 9, an erasing gate electrode is indicated at 10, a tunnel insulating film is indicated at 11, and a silicon oxide film for electrically insulating the erasing gate electrode 10 from the floating gate electrode 5 is indicated at 12 and 13.

The structure of a tunnel region formed between the erasing gate electrode and the floating gate electrode in the floating gate type semiconductor memory comprising the erasing gate according to the prior art shown in FIG. 9, and a method for manufacturing the floating gate type semiconductor memory will be described below.

As shown in FIG. 10, a predetermined portion of the silicon oxide film 8 formed on the semiconductor substrate 1 by the known chemical vapor deposition method is selectively etched. Then, a side wall film made of the silicon oxide film 9 is formed on the side wall of the silicon oxide film 8 by the known chemical vapor deposition method and the anisotropic dry etching technique. Thereafter, the silicon oxide film 4 which acts as a gate insulating film is formed by the thermal oxidation method. Subsequently, a polysilicon film 5, a silicon oxide film 6, a polysilicon film 7, and a silicon oxide film 13 are sequentially laminated over the whole face. The polysilicon films 5 and 7 and the silicon oxide film 13 are formed by a known chemical vapor deposition method. The silicon oxide film 6 is formed by thermally oxidizing the polysilicon film 5.

As shown in FIG. 11, the polysilicon film 7 and the silicon oxide film 13 are selectively etched by a known photoetching technique using a photoresist. Thus, a control gate electrode made of the polysilicon film 7 is formed. Then, a first side wall film made of the silicon oxide film 12 to which impurities are not added and a second side wall film made of a silicon oxide film 14 to which phosphorus or boron is added as impurities are formed on the side walls of the silicon oxide film 13 and the polysilicon film 7 by the known chemical vapor deposition method and the anisotropic dry etching technique. Thus, a double side wall structure is formed.

As shown in FIG. 12, the polysilicon film 5 is etched by using the second side wall film as a mask. Consequently, a floating gate electrode made of the polysilicon film 5 is formed.

As shown in FIG. 13, the second side wall film made of the silicon oxide film 14 is removed by the known wet etching method. In this case, the first side wall film to which the impurities are not added is etched at a speed of 1/50 to 1/100 of that of the silicon oxide film to which the impurities are added. For this reason, the first side wall film is hardly etched. At the wet etching step, a part of the upper face and the side wall of the floating gate electrode are exposed. The exposed portion acts as a tunneling region. Then, the exposed portion is thermally oxidized to form the tunnel insulating film 11. Finally, the erasing gate electrode made of the polysilicon film 10 is formed on the tunnel insulating film 11.

According to the structure of the floating gate type semiconductor memory comprising the erasing gate electrode according to the prior art and the method for manufacturing the floating gate type semiconductor memory, however, the tunneling region is positioned on the exposed portions of a part of the upper face and the side wall of the floating gate electrode. For this reason, the double side wall structure has to be used. Consequently, it is very hard to perform control during manufacture. Thus, there are problems in respect of stability during manufacture. In addition, it is necessary to use, as the second side wall film, the silicon oxide film to which the impurities are added. Usually, the growth of the silicon oxide film to which the impurities are added causes the generation of particles easily. Therefore, there is a possibility that the yield is deteriorated and the reliability is damaged.

SUMMARY OF THE INVENTION

Advantages of the invention include one or more of the following. The present invention provides a semiconductor memory having a floating gate structure comprising an erasing gate electrode in which formation of the tunnel region is facilitated and deterioration in the yield and damage to reliability are avoided. The invention also provides a method for manufacturing a semiconductor memory having such a floating gate structure.

In accordance with the above, in some aspects, the invention relates to a semiconductor memory comprising source and drain regions provided in a semiconductor substrate; a first insulating film provided in a predetermined region on the semiconductor substrate; a floating gate electrode provided on the first insulating film; a control gate electrode provided above the floating gate electrode with a second insulating film disposed therebetween; and an erasing gate electrode separated from the floating gate electrode by a tunneling medium and from the control gate electrode by a side wall insulating film, wherein the tunneling medium is provided on a side wall of the floating gate electrode.

In another aspect, the invention relates to a method for manufacturing a semiconductor memory, comprising the steps of forming source and drain regions on a semiconductor substrate; forming an active region isolated by an element isolation insulating film on the semiconductor substrate; forming a first insulating film on the active region; sequentially laminating a first conductive film, a second insulating film, a second conductive film and a third insulating film on surfaces of the first insulating film and the element isolation insulating film, etching predetermined portions of the second insulating film, the second conductive film and the third insulating film to form a control gate electrode; forming a side wall insulating film on a side wall of the control gate electrode; etching the first conductive film by using the side wall insulating film as a mask to form a floating gate electrode; forming a tunneling insulating film as a tunneling medium on a side wall of the floating gate electrode; and forming an erasing gate electrode made of a third conductive film so as to cover the tunneling insulating film and the side wall insulating film. Preferably, the tunneling insulating film is formed by oxidizing the side wall of the floating gate electrode.

According to the semiconductor memory having the novel structure and the method for manufacturing the semiconductor memory of the present invention, the tunneling region is formed only on the side wall of the floating gate electrode. Consequently, it is not necessary to form the tunneling region by using the double side wall structure according to the prior art. Consequently, it is very easy to perform control during manufacture. Thus, stable manufacture can be performed. Since the side wall film to which the impurities are added are not necessary as is the case with the prior art, the problems do not arise due to the generation of the particles so that the deterioration in the yield and the damage to the reliability are avoided.

DETAILED DESCRIPTION OF THE INVENTION

As a result of study made by the inventors, it was found that a tunneling insulating film is provided only on the side wall of a floating gate electrode so that electrons accumulated in the floating gate electrode can be easily tunneled and discharged into an erasing gate electrode. The present invention has been made based on the result of the study. According to the manufacturing method which implements the above-mentioned structure, it is not necessary to form a tunneling region by using a double side wall structure but by a single side wall structure. Consequently, the control can be performed very easily. Furthermore, it is not necessary to use the side wall film to which impurities are added. Thus, a deterioration in yield and the damage to reliability caused by the generation of particles are avoided.

Figure 1:
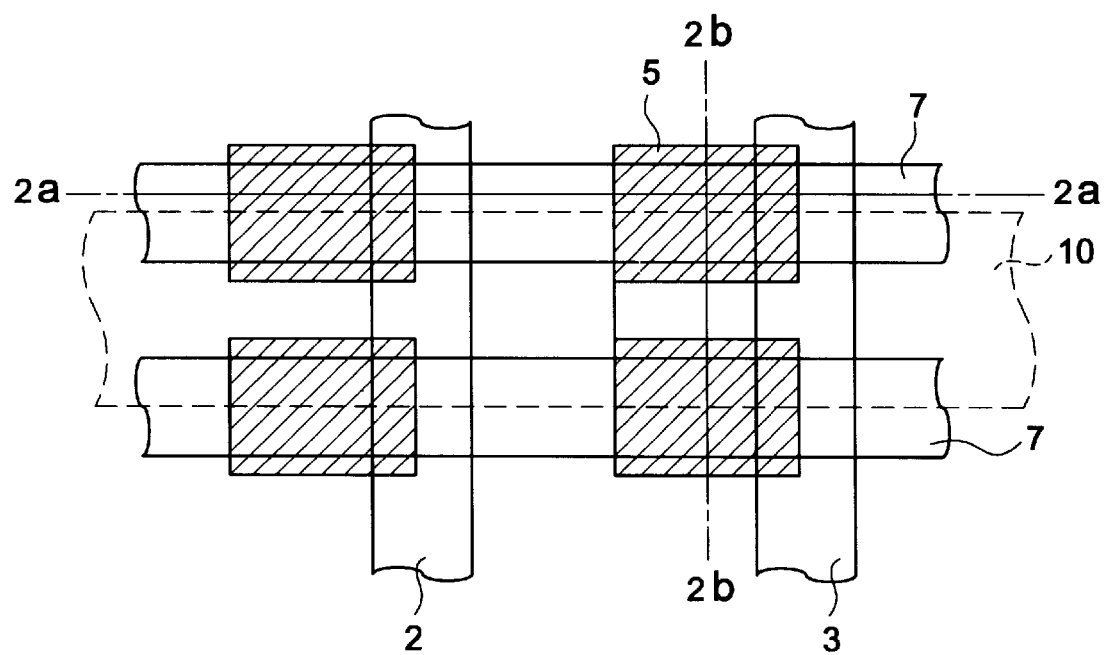
FIG. 1 is a plan view showing a semiconductor memory according to an embodiment of the present invention.
Figure 2:
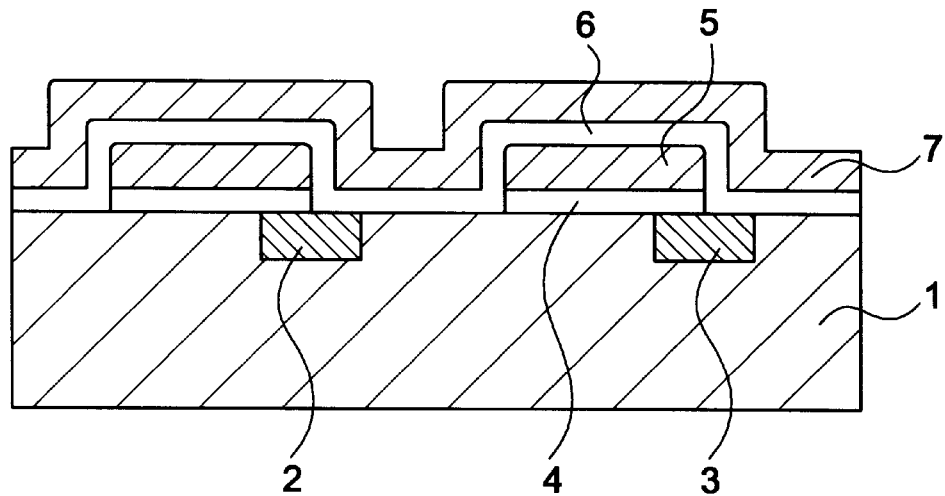
FIGS. 2(*a*) and 2(*b*) are sectional views showing the semiconductor memory shown in FIG. 1.
Figure 2:
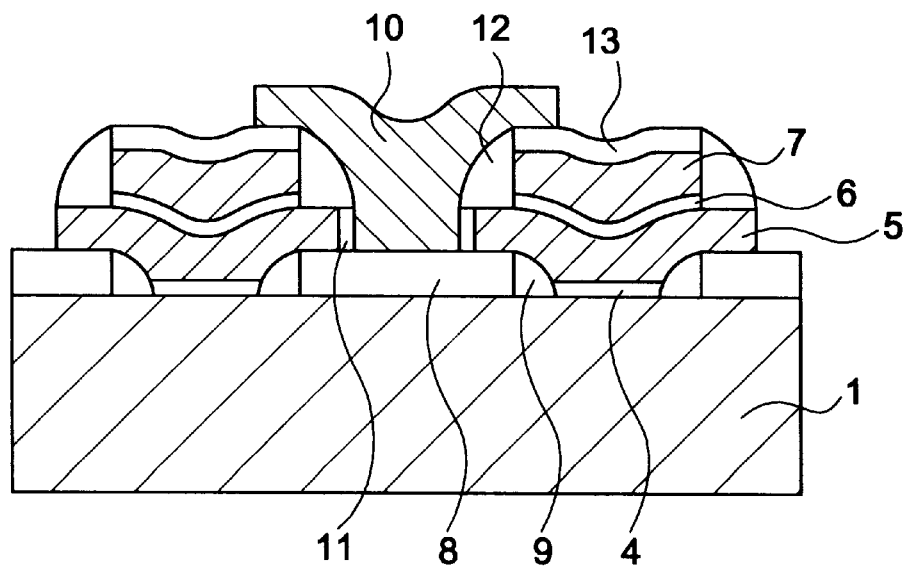
Figure 3:
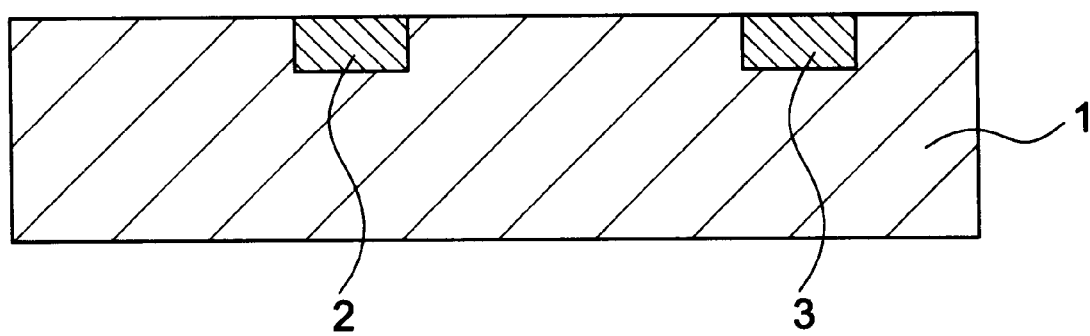
FIGS. 3(*a*) and 3(*b*) are sectional views showing a first step of the manufacture of the semiconductor memory shown in FIGS. 1, and 2(*a*) and 2(*b*)
Figure 3:
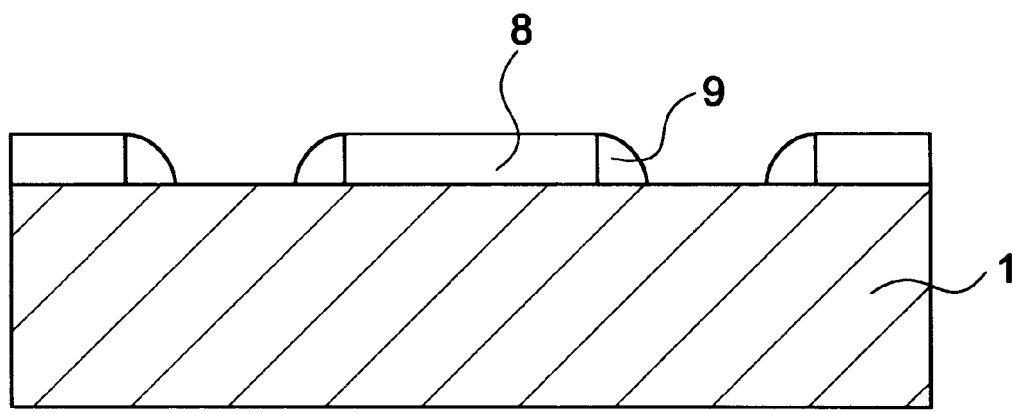
Figure 4:
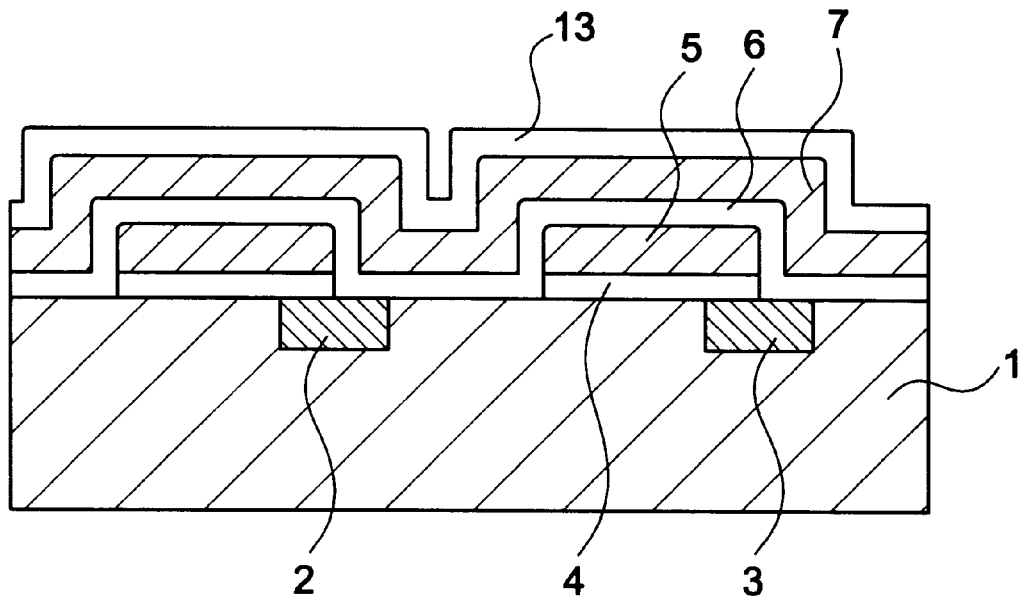
FIGS. 4(*a*) and 4(*b*) are sectional views showing the steps subsequent to the steps shown in FIGS. 3(*a*) and 3(*b*)
Figure 4:
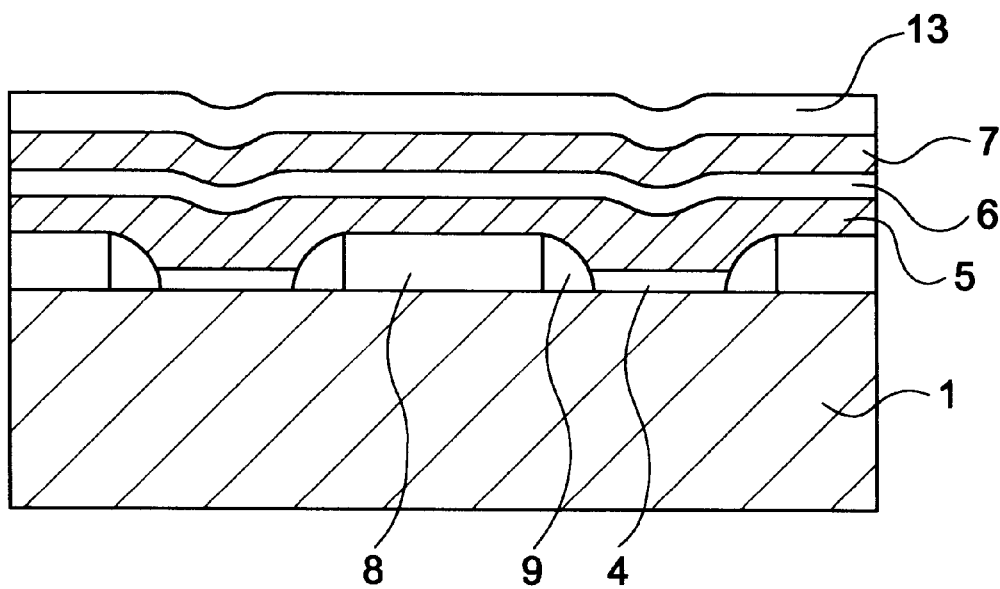
Figure 5:
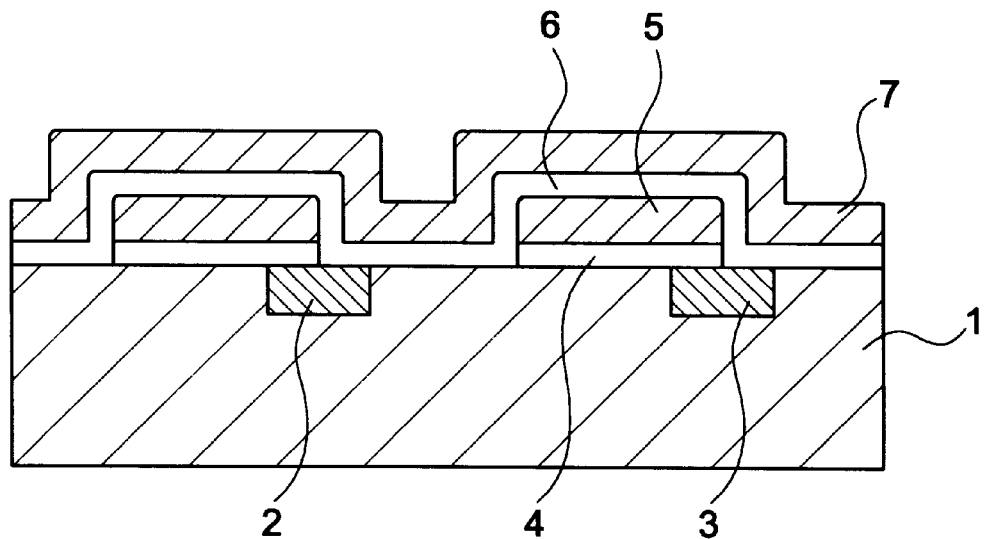
FIGS. 5(*a*) and 5(*b*) are sectional views showing the steps subsequent to the steps shown in FIGS. 4(*a*) and 4(*b*)
Figure 5:
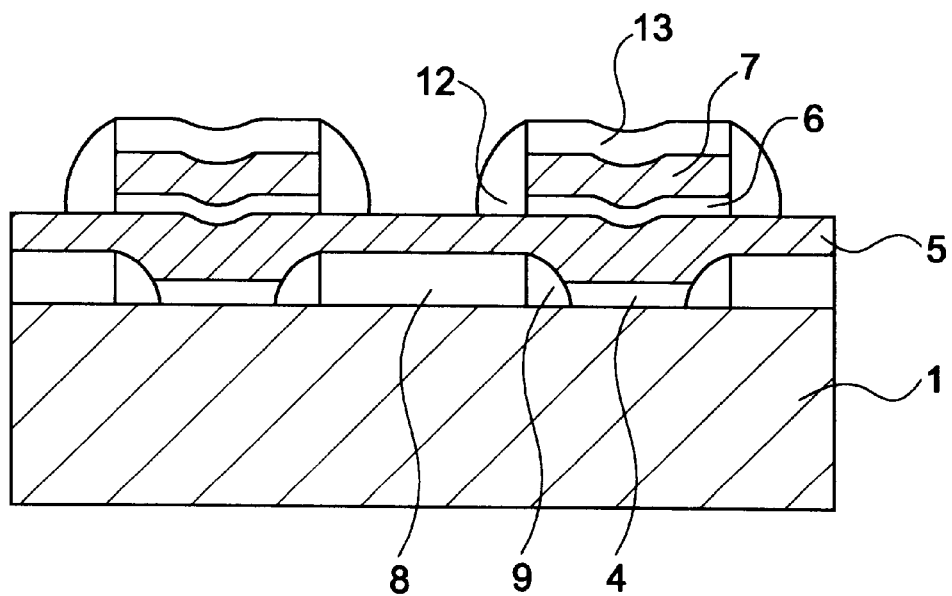
Figure 6:
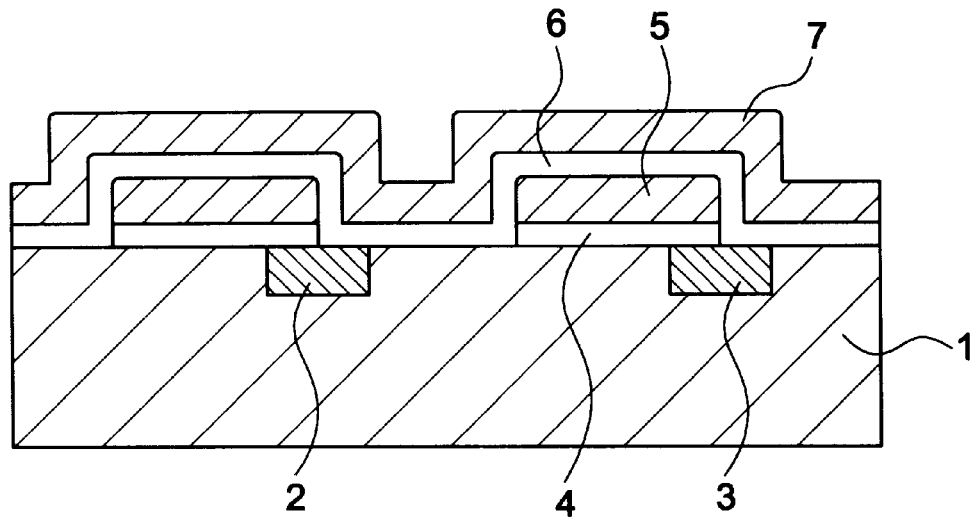
FIGS. 6(*a*) and 6(*b*) are sectional views showing the steps subsequent to the steps shown in FIGS. 5(*a*) and 5(*b*)
Figure 6:
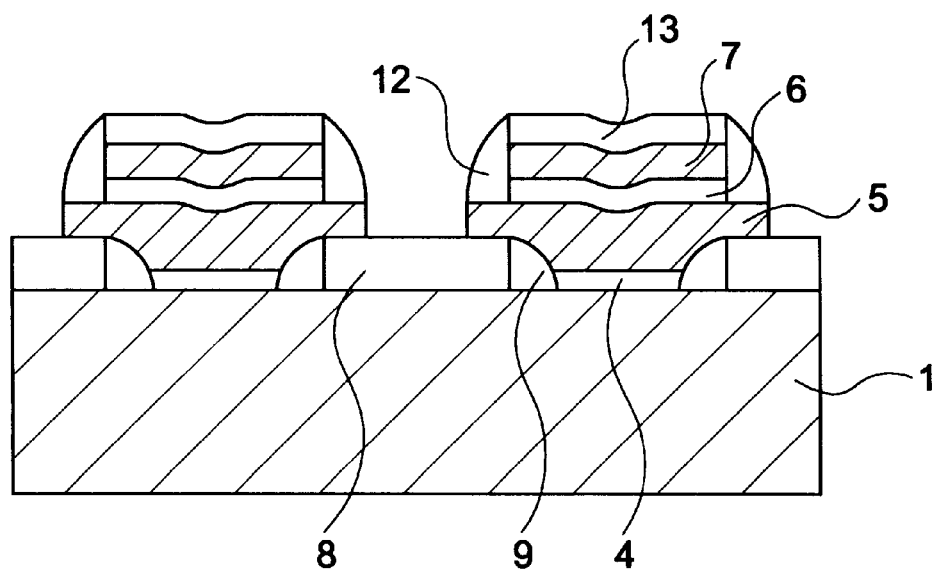
Figure 7:
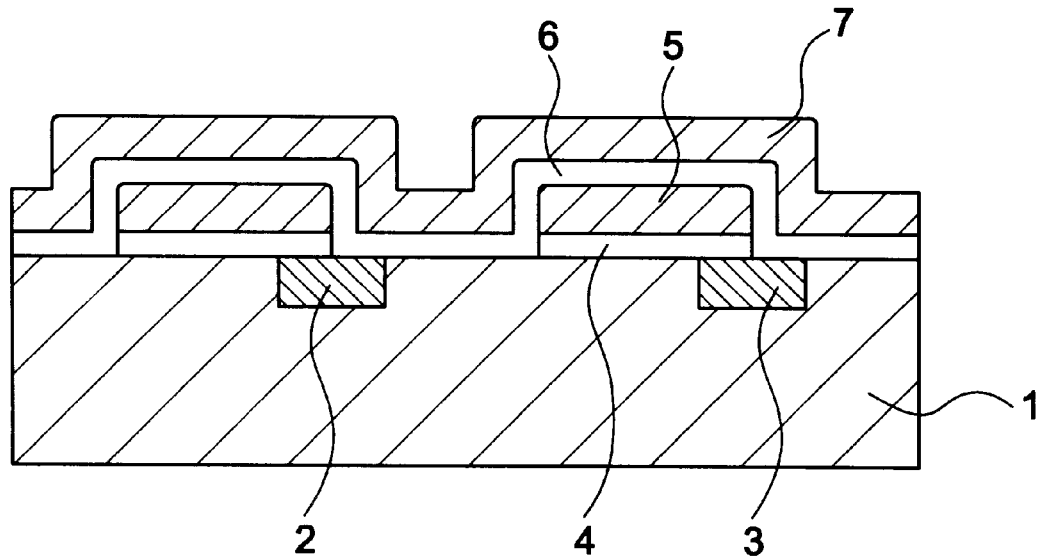
FIGS. 7(*a*) and 7(*b*) are sectional views showing the steps subsequent to the steps shown in FIGS. 6(*a*) and 6(*b*)
Figure 7:
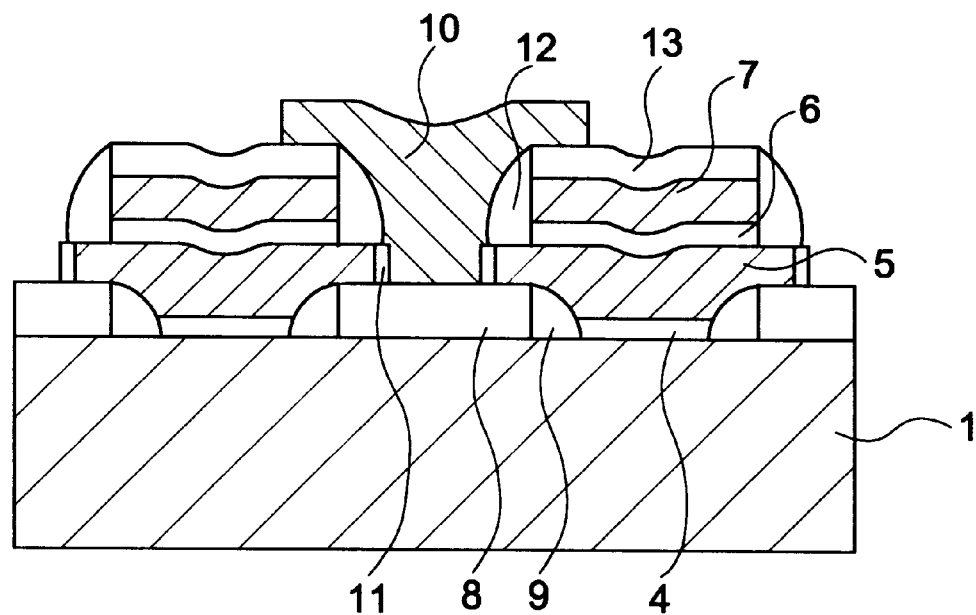
Figure 8:
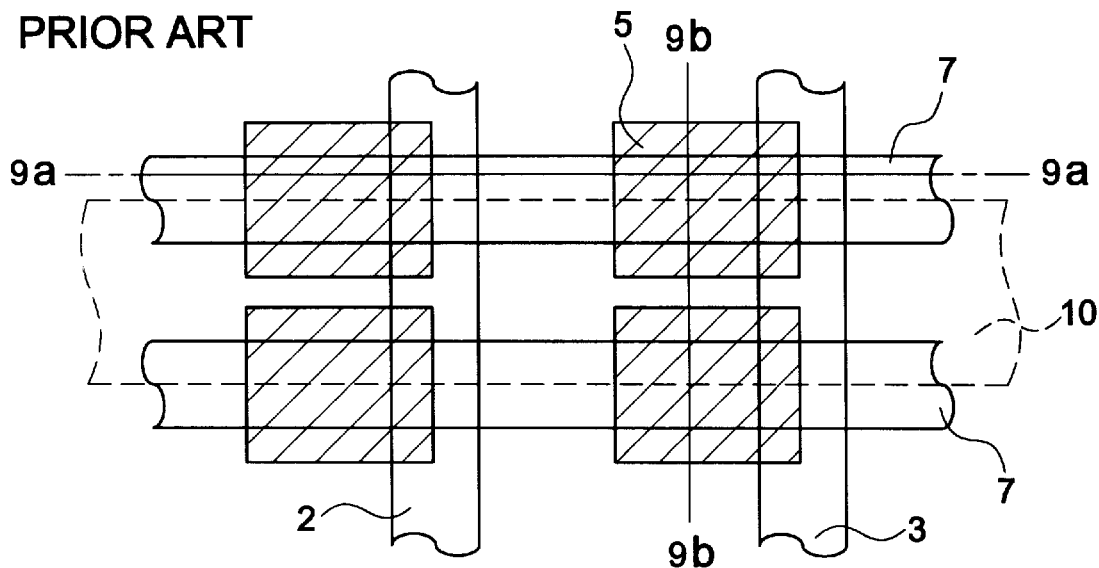
FIG. 8 is a plan view showing a semiconductor memory according to the prior art.
Figure 9:
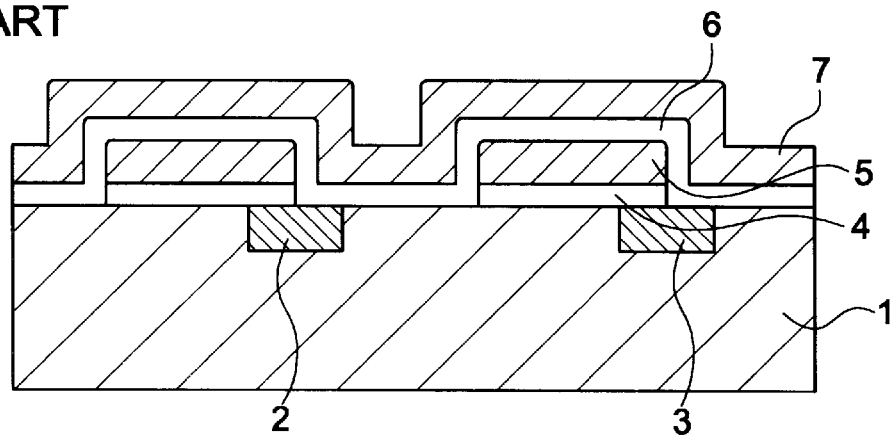
FIGS. 9(*a*) and 9(*b*) are sectional views showing the semiconductor memory in FIG. 8.
Figure 9:
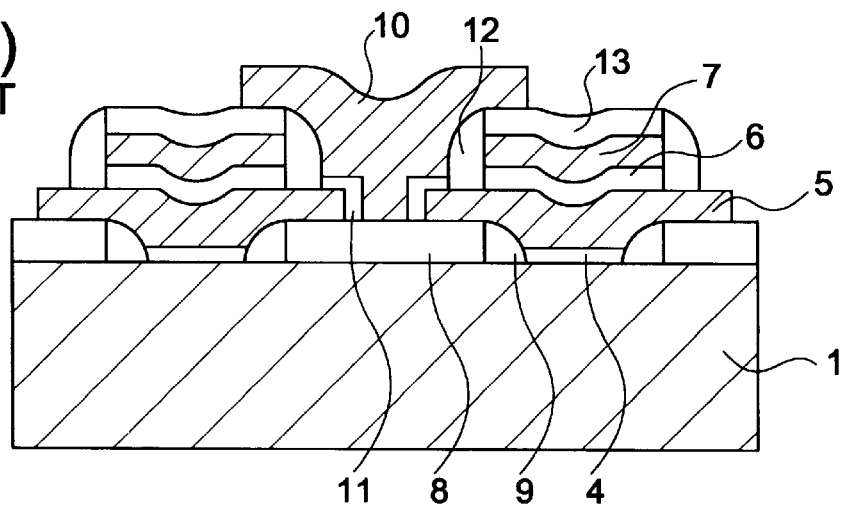
Figure 10:
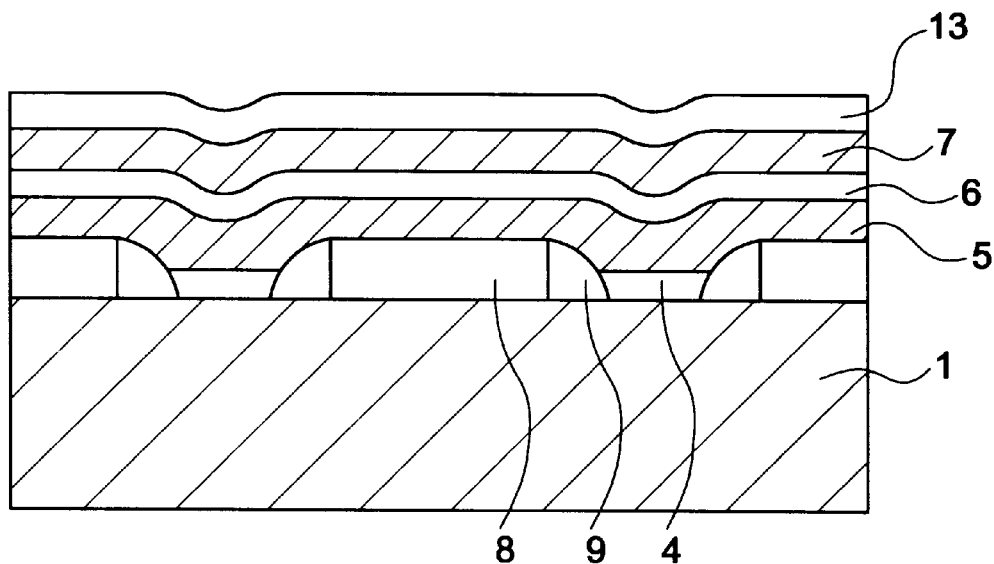
FIG. 10 is a sectional view showing a first step of the manufacture of the semiconductor memory shown in FIGS. 8, and 9(*a*) and 9(*b*)
Figure 11:
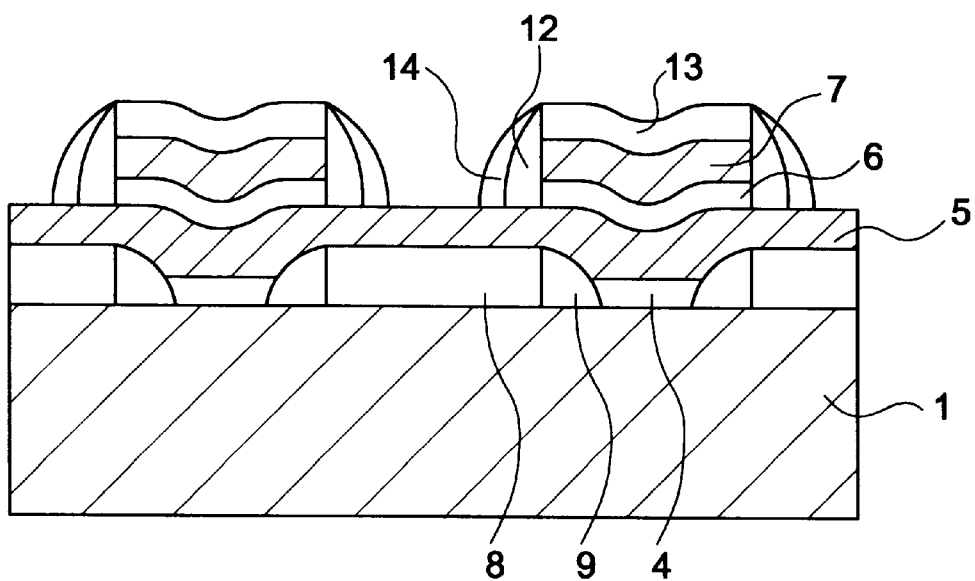
FIG. 11 is a sectional view showing the step subsequent to the step shown in FIG. 10.
Figure 12:
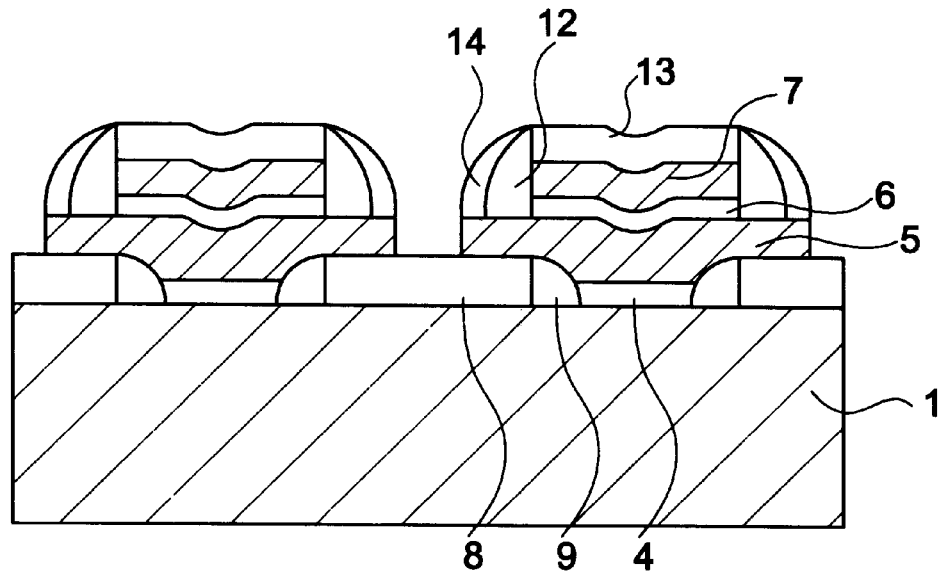
FIG. 12 is a sectional view showing the step subsequent to the step shown in FIG. 11.
Figure 13:
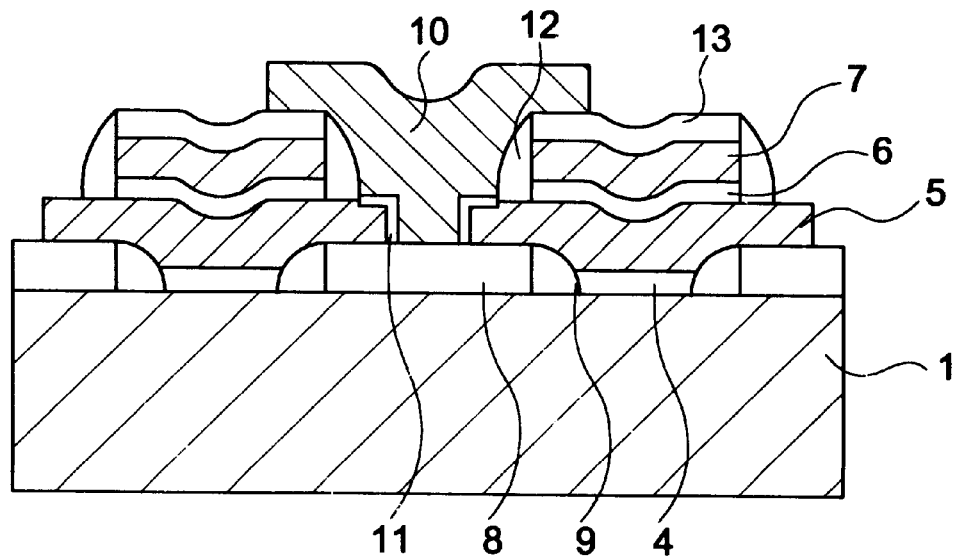
FIG. 13 is a sectional view showing the step subsequent to the step shown in FIG. 12.

A preferred embodiment of the present invention will be described below with reference to the drawings. FIG. 1 is a plan view and FIGS. 2(*a*) and 2(*b*) are sectional views, which show a semiconductor memory according to the present invention, respectively. FIG. 2(*a*) is a sectional view taken along the line A–A' in FIG. 1. FIG. 2(*b*) is a sectional view taken along the line B–B' in FIG. 1.

As shown in FIGS. 2(*a*) and 2(*b*), source and drain regions 2 and 3 made of an N type diffusion layer, and an element isolation insulating film comprising oxide silicon films 8 and 9 is formed on the surface portion of a P type silicon substrate. A gate insulating film made of a silicon oxide film 4 having a thickness of about 30 nm and a floating gate electrode 5 made of a polysilicon film are formed on a part of a channel region disposed between the source region 2 and the drain region 3. A layer insulating film 6 made of a silicon oxide film having a thickness of about 30 nm is formed on the floating gate electrode 5 and other portions on a silicon substrate than the floating gate electrode region. A control gate electrode 7 made of a polysilicon film having a thickness of about 400 nm is formed on the layer insulating film 6. A tunneling insulating film 11 made of a silicon oxide film having a thickness of about 35 nm is formed only on the side wall of the floating gate electrode 5. Furthermore, an erasing gate electrode 10 made of a polysilicon, film having a thickness of about 400 nm is formed so as to cover a tunneling insulating film 11, a silicon oxide film 12 (that has a thickness of about 200 nm), and a silicon oxide film 13 (that has a thickness of about 300 nm).

While an example in which the tunneling insulating film is the silicon oxide film has been described in the above-mentioned embodiment, it is possible to use any insulating film which can act as a tunneling medium such as a silicon nitride film, a two-layered film of a silicon oxide film—a silicon nitride film, a three-layered film of a silicon oxide film—a silicon nitride film—a silicon oxide film, an oxynitride film and a high dielectric film.

While the above-mentioned embodiment has described an example of a split gate structure in which the gate insulating film and the floating gate electrode are formed on a part of the channel region disposed between the source region 2 and the drain region 3, it is apparent that the present invention can also be applied to a stack gate structure in which the gate insulating film and the floating gate electrode are formed over the whole face of a channel disposed between the source region 2 and the drain region 3.

FIGS. 3 to 7 are sectional views sequentially showing each step of the manufacturing method according to a preferred embodiment of the present invention, wherein, in each figure, (a) shows a section taken along the line A–A' in FIG. 1 and (b) shows a section taken along the line B–B' in FIG. 1.

As shown in FIGS. 3(a) and 3(b), source and drain regions 2 and 3 made of an N type diffusion layer are formed on a P type silicon substrate 1 by a known selective diffusion technique. Then, a silicon oxide film 8 is formed in a thickness of 500 nm by a chemical vapor deposition method using TEOS, and then treated at a temperature of 900° C. in a thermal oxidation atmosphere so as to be made finer. Then, a predetermined portion of the silicon oxide film 8 is opened using a known photoetching technique. Thereafter, a silicon oxide film 9 having a thickness of about 200 nm is caused to grow over the whole face by the chemical vapor deposition method using TEOS. Subsequently, a side wall insulating film made of a silicon oxide film 9 is formed on the side wall of the opening by a known anisotropic dry etching technique. The step difference between both ends of an element isolation insulating film made of the silicon oxide film 8 is smoothed by the side wall insulating film.

As shown in FIGS. 4(a) and 4(b), the surface of the P type silicon substrate 1 is oxidized at a temperature of 900° C. by the thermal oxidation method. Consequently, a silicon oxide film 4 is formed. A polysilicon film 5 is formed over the silicon oxide film 4 in a thickness of 350 nm by the chemical vapor deposition method. Then, the predetermined portions of the polysilicon film 5 and the silicon oxide film 4 are selectively etched by the known photoetching technique.

Subsequently, a layer insulating film 6 made of a silicon oxide film is formed over the whole face in a thickness of about 30 nm by the chemical vapor deposition method using TEOS, and heat treated at a temperature of 900° C. so as to be made finer. Then, a polysilicon film 7 is formed in a thickness of about 400 nm by the known chemical vapor deposition method. Thereafter, a silicon oxide film 13 is formed on the polysilicon film 7 in a thickness of about 300 nm by the chemical vapor deposition method using TEOS.

As shown in FIGS. 5(a) and 5(b), the silicon oxide film 13 is etched to leave a portion as a control gate electrode by the known photoetching technique. The polysilicon film 7 is etched by using the silicon oxide film 13 as a mask. Thus, a control gate electrode made of a polysilicon film is formed. Then, a silicon oxide film having a thickness of about 250 nm is caused to grow over the whole face by the chemical vapor deposition method using TEOS. Thereafter, a side wall insulating film made of a silicon oxide film 12 is formed on the side walls of the control gate electrode 7 and the silicon oxide film 13 by the known anisotropic dry etching technique.

As shown in FIGS. 6(a) and 6(b), the polysilicon film 5 is etched by using the side wall insulating film made of the silicon oxide film 12 as a mask. Thus, a floating gate electrode made of the polysilicon film 5 is formed. In this case, only the side wall of the floating gate electrode is exposed as shown in FIG. 6(b).

As shown in FIGS. 7(a) and 7(b), the exposed portion of the side wall of the floating gate electrode 5 is subjected to the thermal oxidation treatment at a temperature of 900° C. in a steam atmosphere. Thus, a tunneling insulating film 11 made of a polysilicon oxide film is formed in a thickness of about 30 nm. Thereafter, a polysilicon film having a thickness of about 400 nm is formed over the whole face by the known chemical vapor deposition method, and selectively etched by the known photoetching technique. Thus, an erasing gate electrode 10 made of the polysilicon film is formed so as to cover the tunneling insulating film 11.

Because a metal wiring step, a passivation film forming step and a bonding pad forming step subsequent to the above-mentioned steps are well-known, their drawings and description will be omitted.

While the silicon oxide film that is formed by oxidizing the polysilicon film has been used as the tunneling insulating film in the above-mentioned embodiment, a silicon nitride film or a multilayered film comprising the silicon nitride film (for example, a two-layered film of a silicon oxide film—a silicon nitride film, a three-layered film of a silicon oxide film—a silicon nitride film—a silicon oxide film, an oxynitride film and the like) may be used.

While the silicon oxide film formed by the chemical vapor deposition method has been used as the layer insulating film 6, a silicon oxide film that is formed by oxidizing the polysilicon film, a silicon nitride film, and a multilayered film that is formed by combining the silicon oxide film and the silicon nitride film (for example, a two-layered film of a silicon oxide film—a silicon nitride film, a three-layered film of a silicon oxide film—a silicon nitride film—a silicon oxide film, an oxynitride film and the like) may be used.

While the above-mentioned embodiment has described an example of the method for manufacturing a split gate structure in which the gate insulating film and the floating gate electrode are formed on a part of the channel region disposed between the source region 2 and the drain region 3, it is apparent that the present invention can also be applied to a stack gate structure in which the gate insulating film and the floating gate electrode are formed over the whole face of the channel region disposed between the source region 2 and the drain region 3.

The invention may be embodied in other forms without departing from the spirit or essential characteristics thereof. The embodiments disclosed in this application are to be considered in all respects as illustrative and not restrictive. The scope of the invention is indicated by the appended claims rather than by the foregoing description, and all changes which come within the meaning and range of equivalency of the claims are intended to be embraced therein.

What is claimed is:

1. A method for manufacturing a semiconductor memory, comprising:

forming source and drain regions on a semiconductor substrate;

forming an active region isolated by an element isolation insulating film on said semiconductor substrate;

forming a first insulating film on said active region;

sequentially laminating a first conductive film, a second insulating film, a second conductive film and a third insulating film on surfaces of said first insulating film and said element isolation insulating film;

etching predetermined portions of said second insulating film, said second conductive film and said third insulating film to form a control gate electrode wherein said etching results in said control gate electrode and said second conductive film having side walls;

forming a side wall insulating film on said side walls of said control gate electrode and said second insulating film;

etching said first conductive film by using said side wall insulating film as a mask to form a floating gate electrode and to expose only a vertical surface of said floating gate electrode;

forming a tunneling insulating film as a tunneling medium only on said vertical surface of said floating gate electrode; and forming an erasing gate electrode made of a third conductive film so as to cover said tunneling insulating film and said side wall insulating film.

2. The method as defined in claim 1, wherein said tunneling insulating film is formed by oxidizing at least one of the vertical surface of said floating gate electrode.

3. The method of claim 1, wherein the tunneling medium comprises silicon oxide, silicon nitride, an oxynitride film or a high dielectric film.

4. The method of claim 1, wherein the second insulating film comprises silicon oxide, silicon nitride or an oxynitride film.

5. The method of claim 1, wherein the floating gate electrode is formed over a portion of a channel region between the source and drain regions.

6. The method of claim 1, wherein the floating gate electrode is formed over an entire channel region between the source and drain regions.

* * * * *